United States Patent
Ge et al.

(10) Patent No.: US 11,309,349 B2
(45) Date of Patent: Apr. 19, 2022

(54) P-TYPE SEMICONDUCTOR LAYERS COUPLED TO N-TYPE SEMICONDUCTOR LAYERS

(71) Applicant: Hewlett-Packard Development Company, L.P., Spring, TX (US)

(72) Inventors: Ning Ge, Palo Alto, CA (US); Robert Ionescu, Palo Alto, CA (US); Helen A Holder, Palo Alto, CA (US); Jarrid Wittkopf, Palo Alto, CA (US)

(73) Assignee: Hewlett-Packard Development Company, L.P., Spring, TX (US)

( * ) Notice: Subject to any disclaimer, the term of this patent is extended or adjusted under 35 U.S.C. 154(b) by 0 days.

(21) Appl. No.: 17/047,300

(22) PCT Filed: Aug. 21, 2018

(86) PCT No.: PCT/US2018/047189
§ 371 (c)(1),
(2) Date: Oct. 13, 2020

(87) PCT Pub. No.: WO2020/040740
PCT Pub. Date: Feb. 27, 2020

(65) Prior Publication Data
US 2021/0167118 A1    Jun. 3, 2021

(51) Int. Cl.
| | |
|---|---|
| H01L 27/15 | (2006.01) |
| H01L 27/144 | (2006.01) |
| H01L 25/065 | (2006.01) |
| H01L 25/18 | (2006.01) |

(52) U.S. Cl.
CPC .......... *H01L 27/15* (2013.01); *H01L 25/0655* (2013.01); *H01L 25/18* (2013.01); *H01L 27/1443* (2013.01)

(58) Field of Classification Search
CPC ..... H01L 27/15; H01L 25/0655; H01L 25/18; H01L 27/1443; H01L 31/022408; H01L 31/02005; H01L 31/18; H01L 31/035281; H01L 33/02; H01L 27/153; H01L 33/20
USPC .......................................................... 257/88
See application file for complete search history.

(56) References Cited

U.S. PATENT DOCUMENTS

| | | | |
|---|---|---|---|
| 8,154,031 B2 | 4/2012 | Grötsch | |
| 9,231,153 B2 | 1/2016 | Chen | |
| 2007/0241356 A1 | 10/2007 | Hsieh | |
| 2008/0179602 A1* | 7/2008 | Negley | H01L 21/2654 257/88 |
| 2014/0061680 A1 | 3/2014 | Schubert | |
| 2015/0371974 A1 | 12/2015 | Bower | |
| 2015/0373793 A1 | 12/2015 | Bower | |
| 2016/0276430 A1* | 9/2016 | Okumura | H01L 29/66136 |
| 2017/0110637 A1 | 4/2017 | Lim | |

(Continued)

*Primary Examiner* — Duy T Nguyen
(74) *Attorney, Agent, or Firm* — Dicke Billig & Czaja PLLC

(57) ABSTRACT

A device includes a P-N junction comprising a monolithic N-type semiconductor layer coupled to a monolithic P-type semiconductor layer. The monolithic N-type semiconductor layer includes a first portion and a second portion. The first portion has a first surface and the second portion has a second surface facing away from the first surface. The monolithic P-type semiconductor layer includes a third portion and a fourth portion. The third portion has a third surface and the fourth portion has a fourth surface facing away from the third surface.

17 Claims, 8 Drawing Sheets

(56) References Cited

U.S. PATENT DOCUMENTS

2017/0194298 A1* 7/2017 Negley .............. H01L 25/0756
2018/0090639 A1 3/2018 Ting

* cited by examiner

US 11,309,349 B2

P-TYPE SEMICONDUCTOR LAYERS COUPLED TO N-TYPE SEMICONDUCTOR LAYERS

BACKGROUND

Displays may use light emitting diodes (LEDs) as the light source for each pixel of the display. Sensors may include an array of photon sensing diodes. LEDs and photon sensing diodes include a P-N junction between an anode and a cathode of the device. LEDs emit light in response to being forward biased. If an LED is reverse biased, no light is emitted.

DETAILED DESCRIPTION

In the following detailed description, reference is made to the accompanying drawings which form a part hereof, and in which is shown by way of illustration specific examples in which the disclosure may be practiced. It is to be understood that other examples may be utilized and structural or logical changes may be made without departing from the scope of the present disclosure. The following detailed description, therefore, is not to be taken in a limiting sense, and the scope of the present disclosure is defined by the appended claims. It is to be understood that features of the various examples described herein may be combined, in part or whole, with each other, unless specifically noted otherwise.

Display devices may be fabricated by first fabricating a light emitting diode (LED) array, such as a micro-LED array or a nano-LED array, on a semiconductor or glass substrate. Each LED may then be lifted off the semiconductor substrate and picked and placed onto a transistor of a thin-film-transistor (TFT) array substrate. The LEDs may then be bonded to the TFT array substrate and inspected to make sure each LED was placed such that each LED will be forward biased during operation of the display. Pick and place technologies may be a barrier to micro-LED and nano-LED displays due to low throughput and/or expensive processes. For example, there may be difficulties in handling small die size LEDs and controlling the LED die orientation, difficulties in achieving LED pick and place assembly tolerances, and difficulties in selectively picking and placing the LEDs, which increases post placing process time and expense.

Accordingly, disclosed herein is a twisted diode pair, such as an LED pair or a photon sensing diode pair. Two diodes having opposite orientations are formed by twisting a monolithic N-type semiconductor layer coupled to a monolithic P-type semiconductor layer. In operation, one of the diodes may be forward biased while the other one of the diodes may be reverse biased. Accordingly, each diode pair may be picked and placed to fabricate a display device or sensor device without having to orient each diode pair prior to placement. In this way, no matter how the diode pair is placed, one of the diodes will be forward biased during operation.

As used herein "monolithic" is defined as fabricated as a single structure.

As used herein "facing away" is defined as facing opposite directions or facing non-parallel directions (e.g., normal vectors for the surfaces are not parallel).

Figure 1:
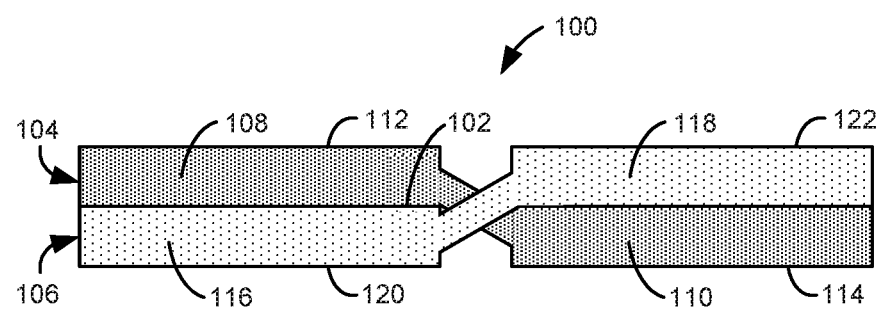
FIG. 1 is a side view illustrating one example of a device including a P-N junction.

FIG. 1 is a side view illustrating one example of a device 100 including a P-N junction 102. P-N junction 102 includes a monolithic N-type semiconductor layer 104 coupled to a monolithic P-type semiconductor layer 106. Monolithic N-type semiconductor layer 104 includes a first portion 108 and a second portion 110 physically connected to the first portion 108. The first portion 108 has a first surface 112 and the second portion 110 has a second surface 114 facing away from the first surface 112. Monolithic P-type semiconductor layer 106 includes a third portion 116 and a fourth portion 118 physically connected to the third portion 116. The third portion 116 has a third surface 120 and the fourth portion 118 has a fourth surface 122 facing away from the third surface 120. In one example, the first surface 112 may be parallel to the third surface 120, and the second surface 114 may be parallel to the fourth surface 122. The first surface 112 may also be parallel to the fourth surface 122, and the second surface 114 may also be parallel to the third surface 120.

In one example, as will be described in more detail below, monolithic N-type semiconductor layer 104 and monolithic P-type semiconductor layer 106 form a first light emitting diode (LED) (e.g., micro-LED, nano-LED) having a first orientation and a second LED having a second orientation opposite to the first orientation. In another example, monolithic N-type semiconductor layer 104 and monolithic P-type semiconductor layer 106 form a first photon sensing diode having a first orientation and a second photon sensing diode having a second orientation opposite to the first orientation.

Figure 2:
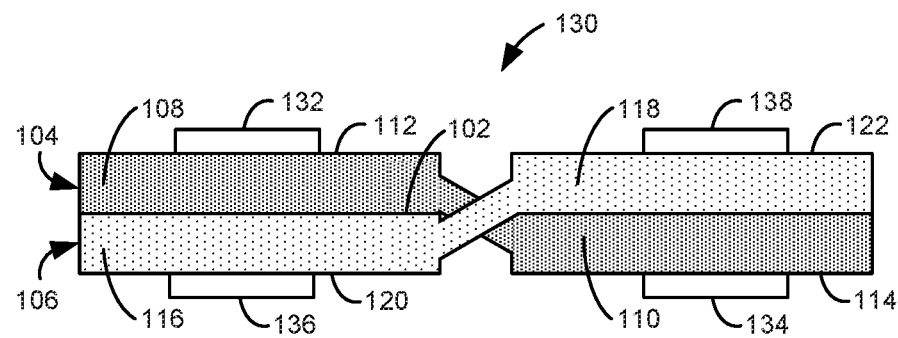
FIG. 2 is a side view illustrating another example of a device including a P-N junction.

FIG. 2 is a side view illustrating another example of a device 130 including a P-N junction 102. Device 130 is similar to device 100 previously described and illustrated with reference to FIG. 1, except that device 130 includes a first contact 132, a second contact 134, a third contact 136, and a fourth contact 138. The first contact 132 is electrically coupled to the first surface 112 of the first portion 108 of the monolithic N-type semiconductor layer 104. The second contact 134 is electrically coupled to the second surface 114 of the second portion 110 of the monolithic N-type semiconductor layer 104. The third contact 136 is electrically coupled to the third surface 120 of the third portion 116 of the monolithic P-type semiconductor 106. The fourth contact 138 is electrically coupled to the fourth surface 122 of the fourth portion 118 of the monolithic P-type semiconductor 106.

Device 130 may include Si, group III-IV elements, organic materials, 2D materials, and/or other semiconductor materials. The monolithic N-type semiconductor layer 104 and the monolithic P-type semiconductor layer 106 have a relatively moderate to large resistivity, such as tens or hundreds of ohms per square meter. For a sheet like P-N junction 102, the active current flows in the localized area near the contacts (i.e., between third contact 136 and first contact 132 and between fourth contact 138 and second contact 134). The remaining portions of the monolithic N-type semiconductor layer 104 and the monolithic P-type semiconductor layer 106 are connected through a large parasitic resistance. Due to the large parasitic resistance, the P-N junction device 130 includes a reverse biased diode in parallel with a forward biased diode even though first portion 108 of monolithic N-type semiconductor layer 104 is physically connected to second portion 110 of monolithic N-type semiconductor layer 104 and third portion 116 of monolithic P-type semiconductor layer 106 is physically connected to fourth portion 118 of monolithic P-type semiconductor layer 106.

Figure 3:
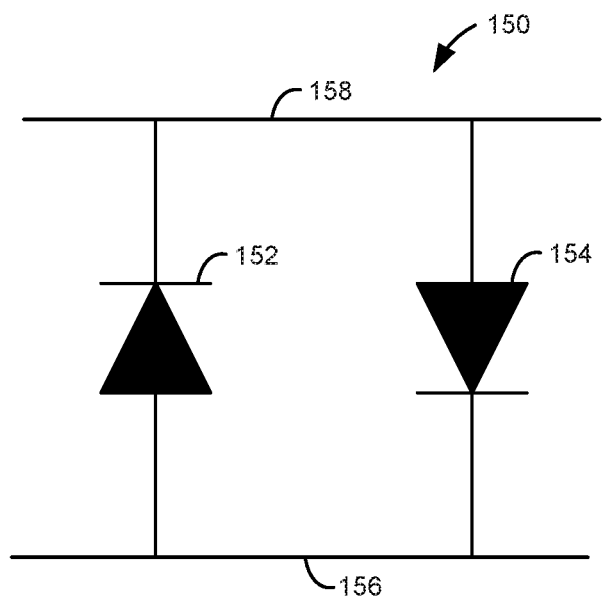
FIG. 3 is a schematic diagram illustrating one example of an equivalent circuit for the device of FIG. 2.

FIG. 3 is a schematic diagram illustrating one example of an equivalent circuit 150 for the device 130 of FIG. 2. Equivalent circuit 150 includes a first diode 152 and a second diode 154. The anode of first diode 152 is electrically coupled to a first node 156, and the cathode of first diode 152 is electrically coupled to a second node 158. The anode of second diode 154 is electrically coupled to the second node 158, and the cathode of second diode 154 is electrically coupled to the first node 156. Therefore, first diode 152 has a first orientation and second diode 154 has a second (i.e., opposite) orientation to the first orientation.

First diode 152 includes first contact 132, first portion 108 of monolithic N-type semiconductor layer 104, third portion 116 of monolithic P-type semiconductor layer 106, and third contact 136 of FIG. 2. Second diode 154 includes second contact 134, second portion 110 of monolithic N-type semiconductor layer 104, fourth portion 118 of monolithic P-type semiconductor layer 106, and fourth contact 138 of FIG. 2. Node 156 is provided by electrically coupling second contact 134 to third contact 136 via, for example, a first electrode. Node 158 is provided by electrically coupling first contact 132 to fourth contact 138 via, for example, a second electrode.

Figure 4A:
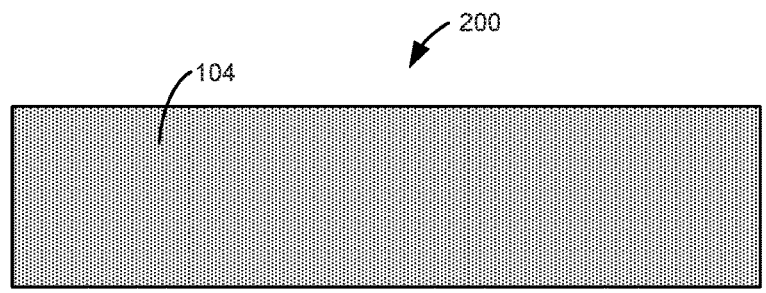
FIGS. 4A and 4B illustrate one example of a device including a P-N junction prior to twisting.
Figure 4B:
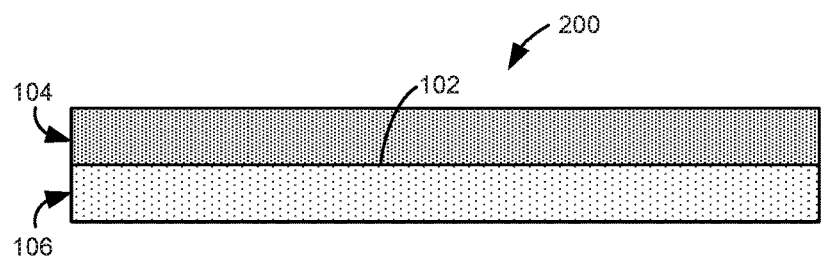

FIGS. 4A and 4B illustrate one example of a device 200 including a P-N junction 102 prior to twisting. FIG. 4A illustrates a top view of device 200, and FIG. 4B illustrates a cross-sectional view of device 200. An N-type semiconductor layer 104 is formed on a P-type semiconductor layer 106 to provide a layer stack. The N-type semiconductor layer 104 and the P-type semiconductor layer 106 may be formed via printing, via photolithography, deposition, and/or etching processes, or via other suitable processes.

Figure 5A:
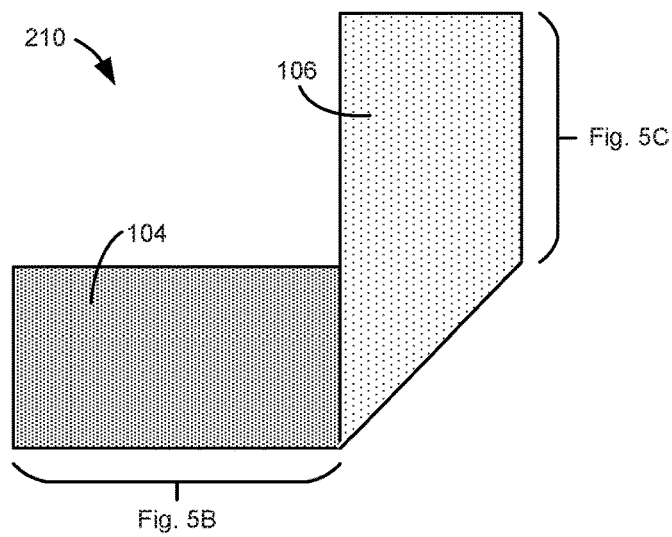
FIGS. 5A-5C illustrate one example of the device of FIGS. 4A and 4B after twisting.
Figure 5B:
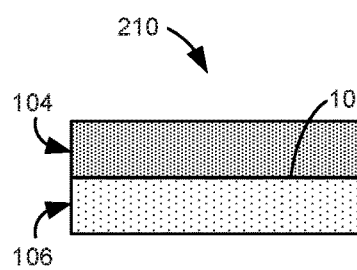
Figure 5C:
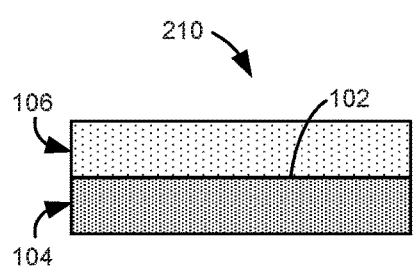

FIGS. 5A-5C illustrate one example of a device 210 after twisting the device 200 of FIGS. 4A and 4B. FIG. 5A illustrates a top view of device 210, FIG. 5B illustrates a cross-sectional view of the portion of device 210 indicated in FIG. 5A, and FIG. 5C illustrates a cross-sectional view of the portion of device 210 indicated in FIG. 5A. As shown in FIG. 5A, device 200 is twisted or folded in the central region of the device to provide device 210 having two diodes (i.e., a diode pair) with opposite orientations. While a single twist or fold is illustrated in FIG. 5A, in other examples device 210 may have multiple twists or folds as long as the resulting device includes a diode pair having opposite orientations. In this example, the twist results in an L-shaped device 210. As shown in FIG. 5B, a first diode includes a P-N junction 102 with the N-type semiconductor layer 104 on the upper side and the P-type semiconductor layer 106 on the lower side. As shown in FIG. 5C, a second diode includes a P-N junction 102 with the P-type semiconductor layer 106 on the upper side and the N-type semiconductor layer 104 on the lower side.

In one example, the N-type semiconductor layer 104 and the P-type semiconductor layer 106 may be twisted mechanically, such as by using a tool. In another example, the N-type semiconductor layer 104 and the P-type semiconductor layer 106 may be twisted by applying thermal energy to the N-type semiconductor layer and the P-type semiconductor layer. In yet another example, the N-type semiconductor layer 104 and the P-type semiconductor layer 106 may be twisted by applying an electrical field or a magnetic field to the N-type semiconductor layer 104 and the P-type semiconductor layer 106. The N-type semiconductor layer 104 and the P-type semiconductor layer 106 may also be twisted by fabricating the N-type semiconductor layer 104 and the P-type semiconductor layer 106 at an elevated temperature and with different stresses in each layer. In this case, when the device cools down, the different stresses in the layers will cause the device to twist.

Figure 6:
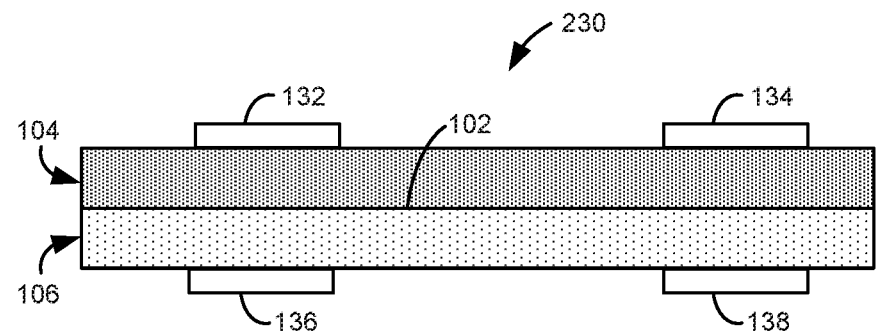
FIG. 6 is a side view illustrating another example of a device including a P-N junction prior to twisting.

FIG. 6 is a side view illustrating another example of a device 230 including a P-N junction 102 prior to twisting. Device 230 is similar to device 200 previously described and illustrated with reference to FIGS. 4A-4B, except that device 230 includes a first contact 132, a second contact 134, a third contact 136, and a fourth contact 138. The first contact 132 is electrically coupled to the upper left side of N-type semiconductor layer 104, and the second contact 134 is electrically coupled to upper right side of N-type semiconductor layer 104. The third contact 136 is electrically coupled to the lower left side of P-type semiconductor layer 106, and the fourth contact 138 is electrically coupled to the lower right side of P-type semiconductor layer 106. The first contact 132 is opposite to and faces away from the third contact 136, and the second contact 134 is opposite to and faces away from the fourth contact 138.

In this example, the first contact 132 and the second contact 134 are electrically coupled to the N-type semiconductor layer 104 and the third contact 136 and the fourth contact 138 are electrically coupled to P-type semiconductor layer 106 prior to twisting the device. First contact 132, second contact 134, third contact 136, and fourth contact 138 may be formed via printing (e.g., inkjetting Ag), via photolithography, deposition, and/or etching processes, or via other suitable processes.

Figure 7:
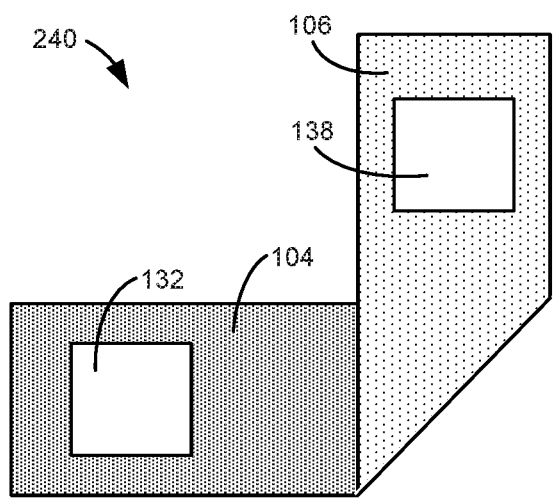
FIG. 7 is a top view illustrating one example of a device after twisting.

FIG. 7 is a top view illustrating one example of a device 240 after twisting. In one example, device 240 is formed by twisting the device 230 of FIG. 6 with first contact 132, second contact 134 (not visible in FIG. 7), third contact 136 (not visible in FIG. 7), and fourth contact 138 already attached. In another example, device 240 is formed by forming first contact 132, second contact 134, third contact 136, and fourth contact 138 on the already twisted device 210 of FIGS. 5A-5C. Accordingly, first contact 132, second contact 134, third contact 136, and fourth contact 138 may be formed prior to twisting the device or after twisting the device.

Figure 8:
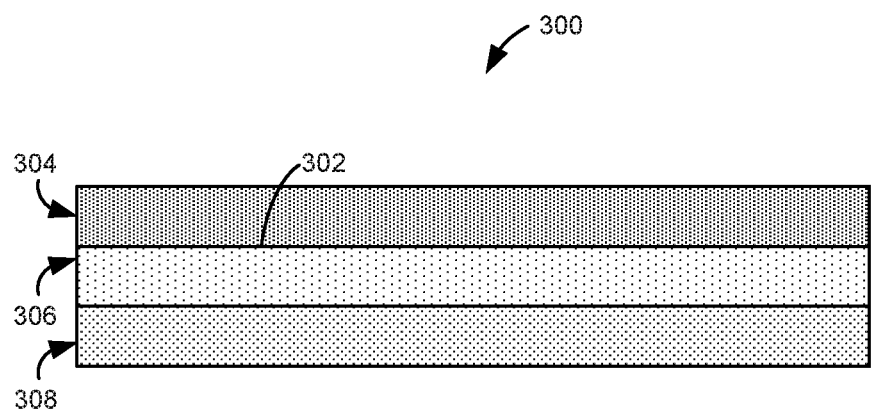
FIG. 8 is a side view illustrating another example of a device including a P-N junction prior to twisting.

FIG. 8 is a side view illustrating another example of a device 300 including a P-N junction 302 prior to twisting. Device 300 includes a single layer graphene (SLG) layer 304, a P-type Tungsten diselenide ($WSe_2$) layer 306, and a hexagonal boron nitride (h-BN) layer 308. P-type WSe$_2$ layer 306 is formed on h-BN layer 308, and SLG layer 304 is formed on P-type WSe$_2$ layer 306. Device 300 may then be twisted and a first contact 132, a second contact 134, a third contact 136, and a fourth contact 138 may be formed either before or after the twisting to provide a twisted diode pair. In this example, each layer of device 300 may be printed.

To achieve efficient electroluminescence, a P-N junction simultaneously injects electrons and holes that recombine to generate a photon emission. Vertically stacked 2D heterostructures like device 300 may be used for this type of application to increase interface area. Optically generated electron hole pairs in Molybdenum disulfide (MoS$_2$) or other similar 2D materials form stable exciton states even at room temperature because of the extremely large Coulomb interactions in atomically thin 2D materials. Rapid carrier leakage in thin vertical semiconductors may limit electroluminescence efficiency so multilayered doped stacks could be of great advantage. This may help indirect bandgap materials achieve better efficiency than direct bandgap monolayer materials. Based on the Aluminum oxide (Al$_2$O$_3$), P-type Gallium Nitride (pGaN), and nMX$_2$ devices, this may be easily achieved. Quantum light emitting diodes may be achieved using single layer graphene combined with a TMD, such as p-doped WSe$_2$ and hexagonal boron nitride as an insulator as in device 300. These may act as quantum light devices (optically active layered semiconductors), which can provide photon generation in the visible spectrum. The stable exciton plays a role in the optical properties of single layered 2D materials such as MoS$_2$.

Quantum yield (QY), which is a ratio of the number of photons that a material emits compared to the number of photons absorbed, may be greatly improved in these 2D structured devices by using chemical doping such as liquid ion gating techniques. Ionic liquid gating using super acids may help improve efficiency and performance of multi stacked heterostructured devices. Quantum yield of MoS$_2$ has been found around 0.1%, but with TFSI treatment about 30% may be achieved. Other chemical doping using TCNQ, F4TCNQ as p-type dopant and NADH n-type dopant may also be useful in structured optical devices.

Figure 9:
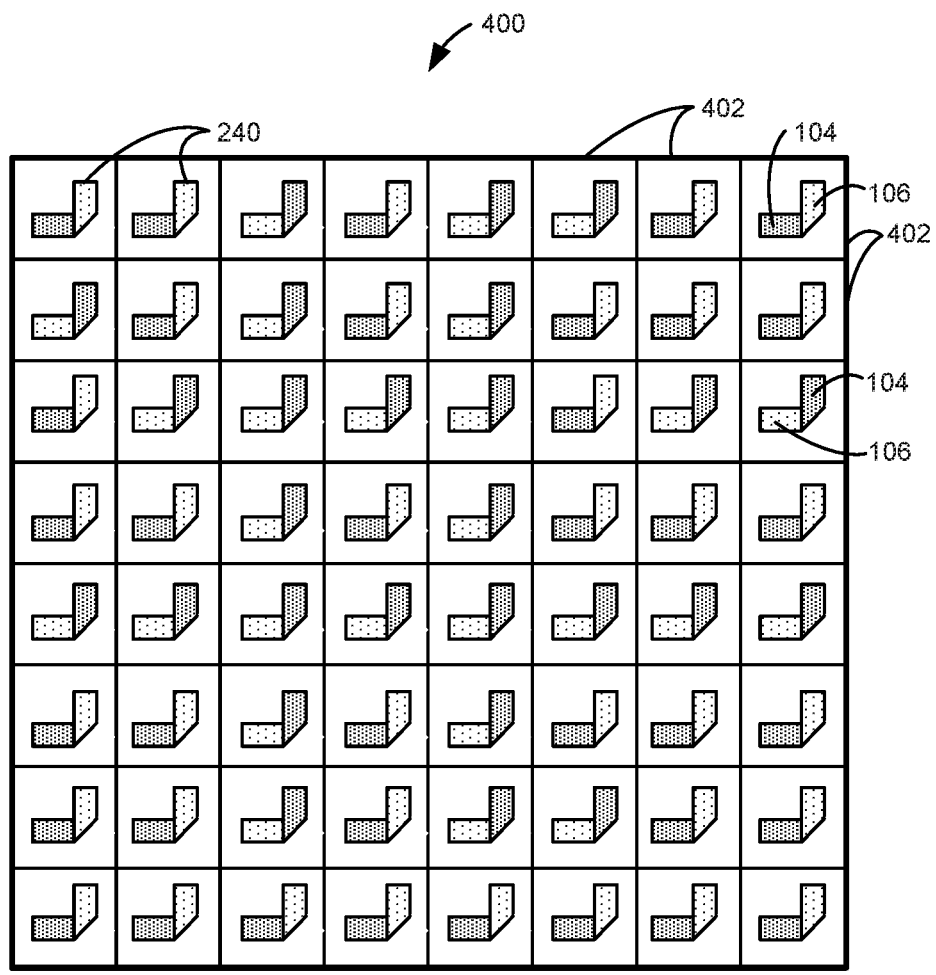
FIG. 9 is a top view illustrating one example of an array of diode pairs.

FIG. 9 is a top view illustrating one example of an array 400 of diode pairs 240. Diode pairs 240 were previously described and illustrated with reference to FIG. 7. The contacts are not illustrated in FIG. 9 for simplicity. Each diode pair 240 may be placed without having to orient each diode pair, since in either orientation one diode will be forward biased and the other diode will be reverse biased. The diode pairs 240 may be arranged in any suitable number of rows and/or columns to provide an array having the desired size. In this example, each pixel 402 includes a single diode pair 240. In other examples, however, each pixel 402 may include more than one diode pair 240. Each diode pair may include an LED pair such that array 400 provides a display, or each diode pair may include a photon sensor diode (e.g., photodiode) pair such that array 400 provides a sensor.

Figure 10:
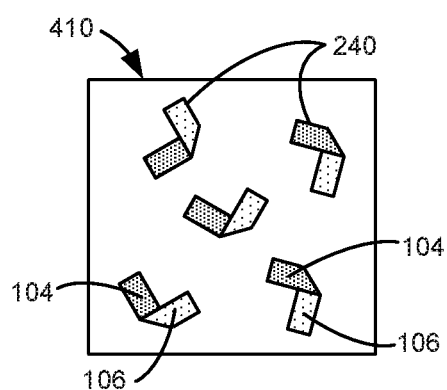
FIG. 10 is a top view illustrating one example of a pixel of an array.

FIG. 10 is a top view illustrating one example of a pixel 410 of an array. In one example, pixel 410 may provide each pixel 402 of array 400 of FIG. 9. In this example, each pixel 410 includes a plurality of diode pairs 240. Within pixel 410, the diode pairs 240 may be placed without having to orient each diode pair, since in either orientation one diode will be forward biased and the other diode will be reverse biased.

Figure 11:
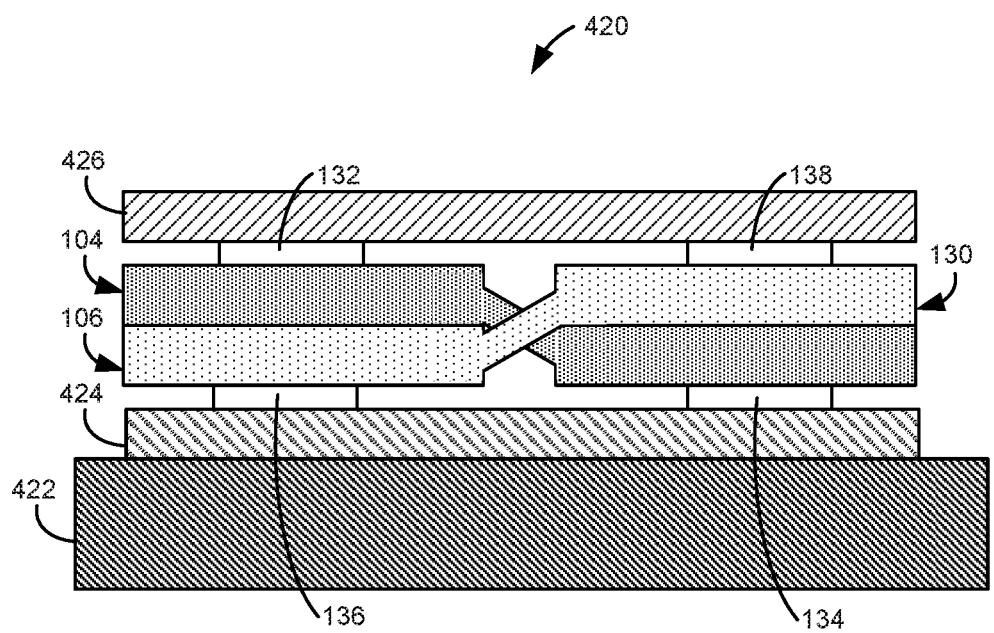
FIG. 11 is a side view illustrating one example of a pixel of an array.

FIG. 11 is a side view illustrating one example of a pixel 420 of an array. Pixel 420 includes a substrate 422, a first electrode 424, a second electrode 426, and a diode pair 130 as previously described and illustrated with reference to FIG. 2. First electrode 424 is coupled to substrate 422 and electrically coupled to second contact 134 and third contact 136 of diode pair 130. In another embodiment, first electrode 424 may be electrically coupled to first contact 132 and fourth contact 138 of diode pair 130. Second electrode 426 is electrically coupled to first contact 132 and fourth contact 138 of diode pair 130. In another embodiment, second electrode 426 may be electrically coupled to second contact 134 and third contact 136 of diode pair 130. First electrode 424 and second electrode 426 may be made of a transparent electrically conductive material, such as Indium tin oxide (ITO), or another suitable material. In one example, pixel 420 may be a pixel of a display, such that each diode pair 130 includes a first LED having a first orientation and a second LED having a second orientation opposite to the first orientation. In another example, pixel 420 may be a pixel of a sensor, such that each diode pair 130 includes a first sensor having a first orientation and a second sensor having a second orientation opposite to the first orientation.

Pixel 420 may be used for each pixel 402 in array 400 of FIG. 9 to provide an array of first electrodes 424, where each first electrode 424 is electrically coupled to a first contact 132 and a fourth contact 138 of a diode pair 130 or to a second contact 134 and a third contact 136 of a diode pair 130. In this case, an array of second electrodes 426 are opposite to the array of first electrodes 424, where each second electrode 424 is electrically coupled to a second contact 134 and a third contact 136 of a diode pair 130 or to a first contact 132 and a fourth contact 138 of a diode pair 130. Therefore, a first portion of the array of first electrodes 424 may be electrically coupled to a first contact 132 and a fourth contact 138 of a diode pair 130, and a second portion of the array of first electrodes 424 may be electrically coupled to a second contact 134 and a third contact 136 of a diode pair 130. Likewise, a first portion of the array of second electrodes 426 may be electrically coupled to a first contact 132 and a fourth contact 138 of a diode pair 130, and a second portion of the array of second electrodes 426 may be electrically coupled to a second contact 134 and a third contact 136 of a diode pair 130. In one embodiment, the array of first electrodes 424 may be coupled to a thin-film-transistor (TFT) array formed on substrate 422 to individually control each pixel 420.

Figure 12A:
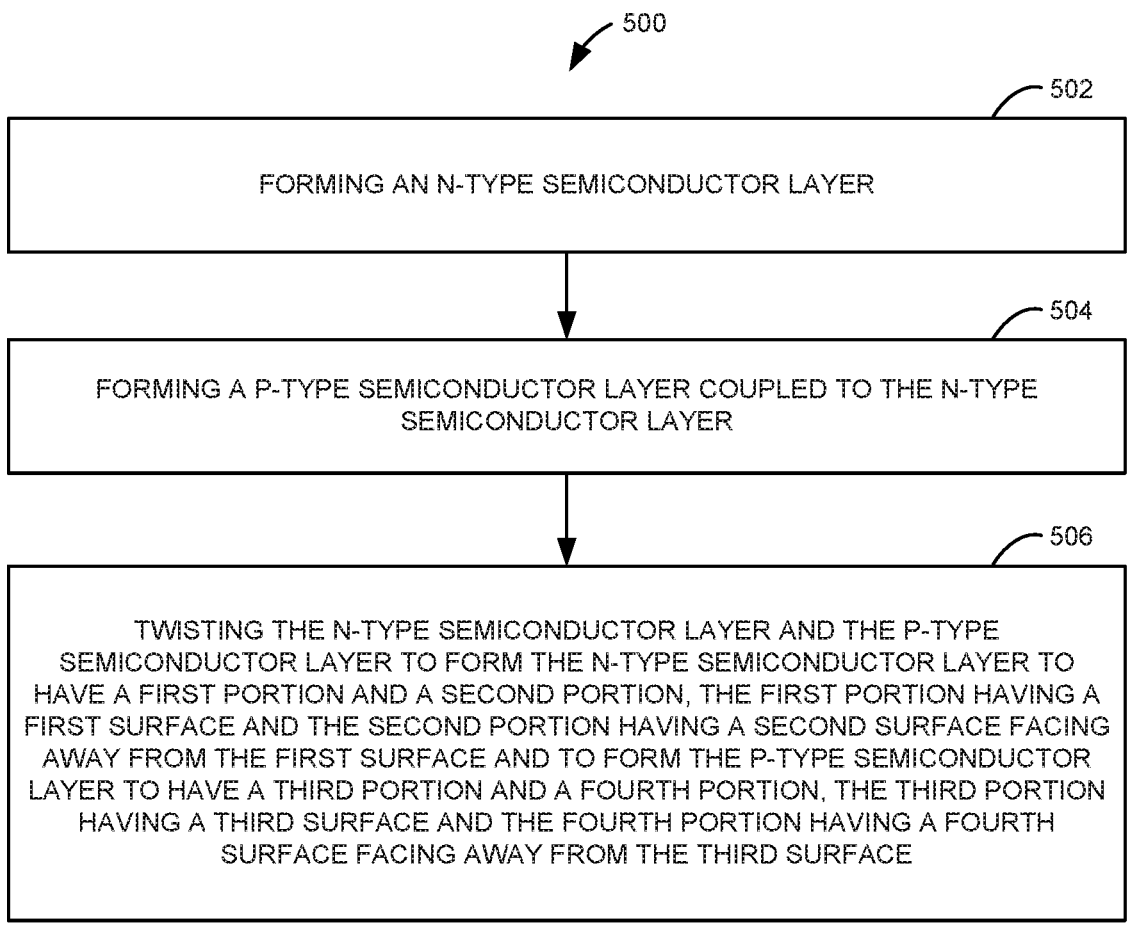
FIGS. 12A and 12B are flow diagrams illustrating one example of a method for fabricating a diode pair.
Figure 12B:
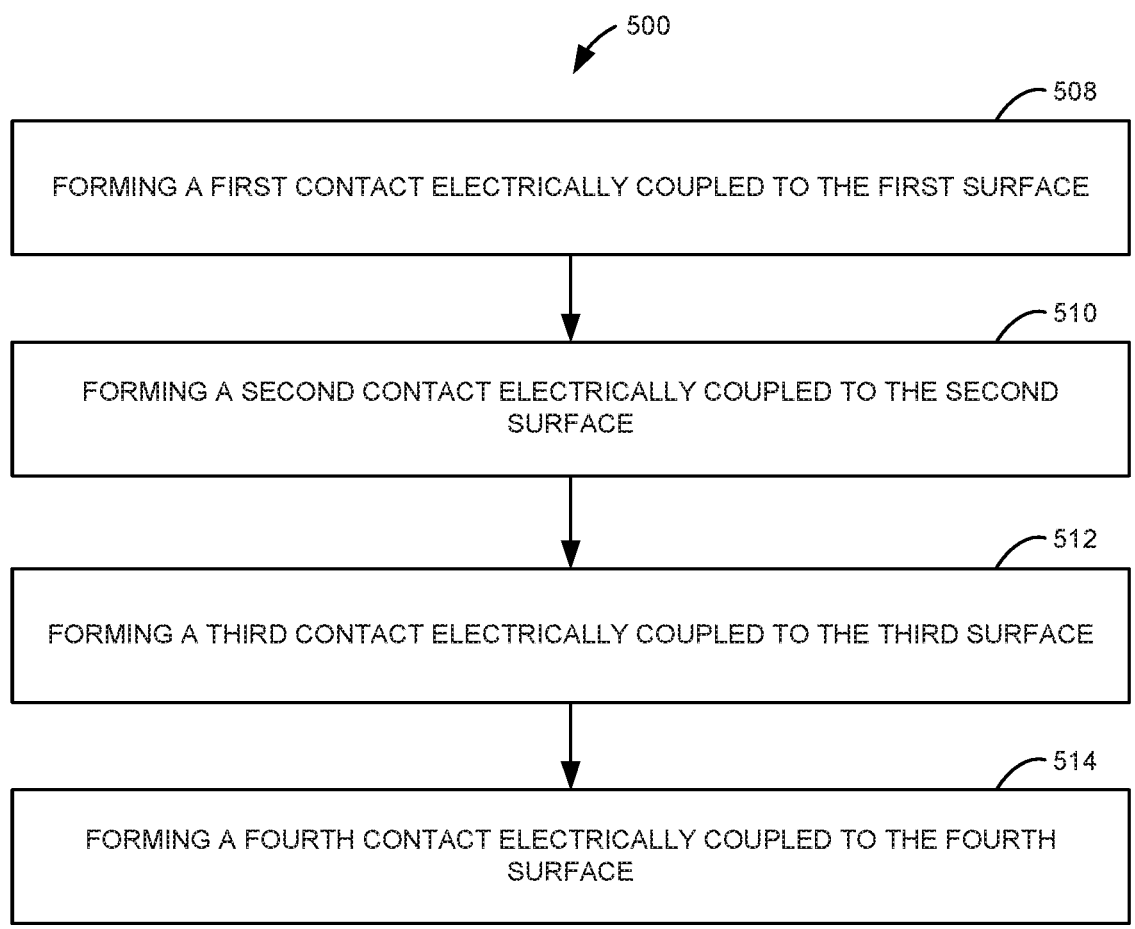

FIGS. 12A and 12B are flow diagrams illustrating one example of a method 500 for fabricating a diode pair. As shown in FIG. 12A, at 502 method 500 includes forming an N-type semiconductor layer. In one example, forming the N-type semiconductor layer comprises printing the N-type semiconductor layer. At 504, method 500 includes forming a P-type semiconductor layer coupled to the N-type semiconductor layer. In one example, forming the P-type semiconductor layer comprises printing the P-type semiconductor layer.

At 506, method 500 includes twisting the N-type semiconductor layer and the P-type semiconductor layer to form the N-type semiconductor layer to have a first portion and a second portion, the first portion having a first surface and the second portion having a second surface facing away from the first surface and to form the P-type semiconductor layer to have a third portion and a fourth portion, the third portion having a third surface and the fourth portion having a fourth surface facing away from the third surface. In one example, twisting the N-type semiconductor layer and the P-type semiconductor layer includes applying thermal energy to the N-type semiconductor layer and the P-type semiconductor layer. In another example, twisting the N-type semiconductor layer and the P-type semiconductor layer includes applying an electrical field or a magnetic field to the N-type semiconductor layer and the P-type semiconductor layer.

As shown in FIG. 12B, at 508 method 500 may further include forming a first contact electrically coupled to the first surface. At 510, method 500 may further include forming a second contact electrically coupled to the second surface. At 512, method 500 may further include forming a third contact electrically coupled to the third surface. At 514, method 500 may further include forming a fourth contact electrically coupled to the fourth surface.

Although specific examples have been illustrated and described herein, a variety of alternate and/or equivalent implementations may be substituted for the specific examples shown and described without departing from the scope of the present disclosure. This application is intended to cover any adaptations or variations of the specific examples discussed herein. Therefore, it is intended that this disclosure be limited only by the claims and the equivalents thereof.

The invention claimed is:

1. A device comprising:
a P-N junction comprising a monolithic N-type semiconductor layer coupled to a monolithic P-type semiconductor layer,
wherein the monolithic N-type semiconductor layer includes a first portion and a second portion, the first portion having a first surface and the second portion having a second surface facing away from the first surface, and
wherein the monolithic P-type semiconductor layer includes a third portion and a fourth portion, the third portion having a third surface and the fourth portion having a fourth surface facing away from the third surface,
wherein the first portion of the monolithic N-type semiconductor layer and the third portion of the monolithic P-type semiconductor have a first orientation and the second portion of the monolithic N-type semiconductor layer and the fourth portion of the monolithic P-type semiconductor layer have a second orientation opposite to the first orientation.

2. The device of claim 1, further comprising:
a first contact coupled to the first surface;
a second contact coupled to the second surface;
a third contact coupled to the third surface; and
a fourth contact coupled to the fourth surface.

3. The device of claim 1, wherein the first portion of the monolithic N-type semiconductor layer and the third portion of the monolithic P-type semiconductor layer form a first light emitting diode (LED) having the first orientation and the second portion of the monolithic N-type semiconductor layer and the fourth portion of the monolithic P-type semiconductor layer form the second LED having the second orientation opposite to the first orientation.

4. The device of claim 1, wherein the first portion of the monolithic N-type semiconductor layer and the third portion of the monolithic P-type semiconductor layer form a first photon sensing diode having the first orientation and the second portion of the monolithic N-type semiconductor layer and the fourth portion of the monolithic P-type semiconductor layer form a second photon sensing diode having the second orientation opposite to the first orientation.

5. The device of claim 1, wherein the first surface is parallel to the fourth surface and the second surface is parallel to the third surface.

6. The device of claim 1, wherein the first surface is aligned with the fourth surface, and the second surface is aligned with the third surface.

7. The device of claim 1, wherein the first portion and the fourth portion are arranged in a first plane, and the second portion and the third portion are arranged in a second plane parallel to the first plane.

8. A device comprising:
an array of diode pairs, each diode pair comprising:
a monolithic N-type semiconductor layer having a first portion and a second portion, the first portion having a first surface and the second portion having a second surface facing away from the first surface;
a monolithic P-type semiconductor layer coupled to the monolithic N-type semiconductor layer, the monolithic P-type semiconductor layer having a third portion and a fourth portion, the third portion having a third surface and the fourth portion having a fourth surface facing away from the third surface;
a first contact coupled to the first surface;
a second contact coupled to the second surface;
a third contact coupled to the third surface; and
a fourth contact coupled to the fourth surface; and
an array of first electrodes, each first electrode electrically coupled to the first contact and the fourth contact of a corresponding diode pair of the array of diode pairs or to the second contact and the third contact of the corresponding diode pair,
wherein each diode pair comprises a first light emitting diode (LED) having a first orientation and a second LED having a second orientation opposite to the first orientation.

9. The device of claim 8, further comprising:
an array of second electrodes opposite to the array of first electrodes, each second electrode electrically coupled to the second contact and the third contact of the corresponding diode pair or to the first contact and the fourth contact of the corresponding diode pair.

10. The device of claim 8, wherein a first portion of the array of first electrodes are electrically coupled to the first contact and the fourth contact of the corresponding diode pair and a second portion of the array of first electrodes are electrically coupled to the second contact and the third contact of the corresponding diode pair.

11. The device of claim 8, wherein the first surface is aligned with the fourth surface, and the second surface is aligned with the third surface.

12. The device of claim 8, wherein the first portion and the fourth portion are arranged in a first plane, and the second portion and the third portion are arranged in a second plane parallel to the first plane.

13. A device comprising:
an array of diode pairs, each diode pair comprising:
a monolithic N-type semiconductor layer having a first portion and a second portion, the first portion having a first surface and the second portion having a second surface facing away from the first surface;
a monolithic P-type semiconductor layer coupled to the monolithic N-type semiconductor layer, the monolithic P-type semiconductor layer having a third portion and a fourth portion, the third portion having a third surface and the fourth portion having a fourth surface facing away from the third surface;
a first contact coupled to the first surface;
a second contact coupled to the second surface;
a third contact coupled to the third surface; and
a fourth contact coupled to the fourth surface; and an array of first electrodes, each first electrode electrically coupled to the first contact and the fourth contact of a diode pair of the array of diode pairs or to the second contact and the third contact of a diode pair of the array of diode pairs, wherein each diode pair comprises a first sensor having a first orientation and a second sensor having a second orientation opposite to the first orientation.

14. The device of claim 13, further comprising:

an array of second electrodes opposite to the array of first electrodes, each second electrode electrically coupled to the second contact and the third contact of the corresponding diode pair or to the first contact and the fourth contact of the corresponding diode pair.

15. The device of claim 13, wherein a first portion of the array of first electrodes are electrically coupled to the first contact and the fourth contact of the corresponding diode pair and a second portion of the array of first electrodes are electrically coupled to the second contact and the third contact of the corresponding diode pair.

16. The device of claim 13, wherein the first surface is aligned with the fourth surface, and the second surface is aligned with the third surface.

17. The device of claim 13, wherein the first portion and the fourth portion are arranged in a first plane, and the second portion and the third portion are arranged in a second plane parallel to the first plane.

\* \* \* \* \*